(12) United States Patent
Kim

(10) Patent No.: US 11,217,539 B2
(45) Date of Patent: Jan. 4, 2022

(54) PACKAGE SUBSTRATE AND SEMICONDUCTOR PACKAGE INCLUDING THE SAME

(71) Applicant: Samsung Electronics Co., Ltd., Suwon-si (KR)

(72) Inventor: Chulwoo Kim, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/750,370

(22) Filed: Jan. 23, 2020

(65) Prior Publication Data
US 2021/0013156 A1   Jan. 14, 2021

(30) Foreign Application Priority Data
Jul. 12, 2019   (KR) .................. 10-2019-0084564

(51) Int. Cl.
*H01L 23/00* (2006.01)
*H01L 23/538* (2006.01)
*H01L 25/065* (2006.01)

(52) U.S. Cl.
CPC ........ *H01L 23/562* (2013.01); *H01L 23/5385* (2013.01); *H01L 23/5386* (2013.01); *H01L 25/0657* (2013.01)

(58) Field of Classification Search
CPC ............... H01L 23/562; H01L 23/5385; H01L 23/5386; H01L 23/49827; H01L 23/49822; H01L 23/3128; H01L 23/3135; H01L 25/0657; H01L 25/0652; H01L 25/0655; H01L 25/105; H01L 2225/1058

USPC ... 257/773, 774, 778, 737, E23.01, E23.179, 257/E23.114, E23.098, E23.021, E25.013, 257/E25.017, E21.599, E21.589, E21.511, 257/E21.506, E29.005, E29.023; 365/764, 768, 783; 438/672, 622, 618, 438/126, 106

See application file for complete search history.

(56) References Cited

U.S. PATENT DOCUMENTS

| | | | |
|---|---|---|---|
| 7,901,998 B2 | 3/2011 | Sri-Jayantha et al. | |
| 8,014,154 B2 | 9/2011 | Lee | |
| 8,217,271 B2 | 7/2012 | Okazaki | |
| 9,105,535 B2 | 8/2015 | Blackshear et al. | |
| 9,297,971 B2 * | 3/2016 | Thacker | H01L 25/0655 |
| 9,478,578 B2 | 10/2016 | Jeng et al. | |

(Continued)

FOREIGN PATENT DOCUMENTS

| | | | |
|---|---|---|---|
| JP | 2003-152289 A | 5/2003 | |
| JP | 2009-252770 A | 10/2009 | |

*Primary Examiner* — Dao H Nguyen
(74) *Attorney, Agent, or Firm* — Muir Patent Law, PLLC

(57) ABSTRACT

Disclosed are package substrates and semiconductor packages including the same. A package substrate may have a plurality of corner regions; a core layer having a first surface and a second surface; an upper layer, which includes a plurality of first wiring structures and a plurality of first dielectric layers; and a lower layer, which includes a plurality of second wiring structures and a plurality of second dielectric layers. Additionally, an area proportion of top surfaces of the first wiring structures in the upper layer relative to a top surface of the upper layer on each of the corner regions is less than an area proportion of top surfaces of the second wiring structures in the lower layer relative to a top surface of the lower layer on each of the corner regions.

12 Claims, 10 Drawing Sheets

(56) References Cited

U.S. PATENT DOCUMENTS

| | | |
|---|---|---|
| 9,609,744 B2 | 3/2017 | Hoffmeyer et al. |
| 10,485,098 B2 * | 11/2019 | Miki ..................... H05K 1/186 |
| 10,622,292 B2 * | 4/2020 | Kang ................... H01L 21/486 |
| 2003/0031830 A1 | 2/2003 | Sun et al. |
| 2006/0012967 A1 * | 1/2006 | Asai ..................... H05K 1/0274 |
| | | 361/764 |
| 2014/0301058 A1 * | 10/2014 | Sunohara .......... H01L 23/49827 |
| | | 361/783 |
| 2016/0020163 A1 * | 1/2016 | Shimizu ............ H01L 23/49822 |
| | | 361/768 |
| 2016/0379937 A1 | 12/2016 | Cho et al. |
| 2018/0158771 A1 * | 6/2018 | Akiba ..................... H01L 24/97 |

* cited by examiner

US 11,217,539 B2

PACKAGE SUBSTRATE AND SEMICONDUCTOR PACKAGE INCLUDING THE SAME

CROSS-REFERENCE TO RELATED APPLICATION

This U.S. nonprovisional application claims priority under 35 U.S.C § 119 to Korean Patent Application No. 10-2019-0084564 filed on Jul. 12, 2019 in the Korean Intellectual Property Office, the entire contents of which are hereby incorporated by reference.

BACKGROUND

The present inventive concepts relate to a package substrate and a semiconductor package including the same, and more particularly, to a package substrate which prevents the occurrence of warpage and a semiconductor package including the same.

The electronic industry has recently been moving to smaller and thinner printed circuit boards with the rapid development of thinner, lighter, and smaller electronic products having higher packing density. As package substrates become thinner and package products become compact, package substrates suffer from damage and/or warpage at their portions on which no semiconductor chips are mounted in fabrication processes. Since warpage of package substrates causes reliability issues, it is important to control the occurrence of warpage.

SUMMARY

Some example embodiments of the present inventive concepts provide a package substrate with improved reliability and a semiconductor package including the same.

According to some example embodiments of the present inventive concepts, a semiconductor package may comprise: a package substrate which includes a plurality of corner regions and a first semiconductor chip on the package substrate. The package substrate may further include a core layer having a first surface and a second surface opposite the first surface; an upper layer, which includes a plurality of first wiring structures and a plurality of first dielectric layers, on the first surface of the core layer; and a lower layer, which includes a plurality of second wiring structures and a plurality of second dielectric layers, on the second surface of the core layer. Additionally, an area proportion of top surfaces of the first wiring structures in the upper layer relative to a top surface of the upper layer on each of the corner regions is less than an area proportion of top surfaces of the second wiring structures in the lower layer relative to a top surface of the lower layer on each of the corner regions.

According to some example embodiments of the present inventive concepts, a package substrate may comprise: a core layer having a first surface and a second surface; and an upper layer which is on a first surface of the core layer and includes a plurality of first corner regions, and a lower layer which is on a second surface of the core layer and includes a plurality of second corner regions. The upper layer may further include a plurality of first dielectric layers and a plurality of first wiring structures that extend into the plurality of first corner regions. The lower layer may further include a plurality of second dielectric layers and a plurality of second wiring structures that extend into the plurality of first corner regions. For each corner region, a difference between an area proportion of top surfaces of the first wiring structures relative to a total plan view area covered by the first corner region, and an area proportion of top surfaces of the second wiring structures relative to the total plan view area covered by the second corner region, is within a range of 10% to 50%."

According to some example embodiments of the present inventive concepts, a semiconductor package may comprise: a package substrate which includes a plurality of corner regions and a chip stack region, the plurality of corner regions including corresponding corners of the package substrate, the chip stack region being a remaining region of the package substrate other than the corner regions. The semiconductor package may include an interposer substrate on the package substrate, a plurality of terminals between the interposer substrate and the chip stack region of the package substrate, and a semiconductor chip. Example embodiments may include at least one chip stack on the interposer substrate. The package substrate may further include a core layer; an upper layer on a first surface of the core layer, the upper layer including a plurality of first wiring structures and a plurality of first dielectric layers; and a lower layer on a second surface of the core layer, the lower layer including a plurality of second wiring structures and a plurality of second dielectric layers, the second surface being opposite to the first surface. In example embodiments, a thermal expansion coefficient of the upper layer on each of the corner regions may be greater than a thermal expansion coefficient of the lower layer on each of the corner regions.

DETAILED DESCRIPTION OF EMBODIMENTS

Figure 1:
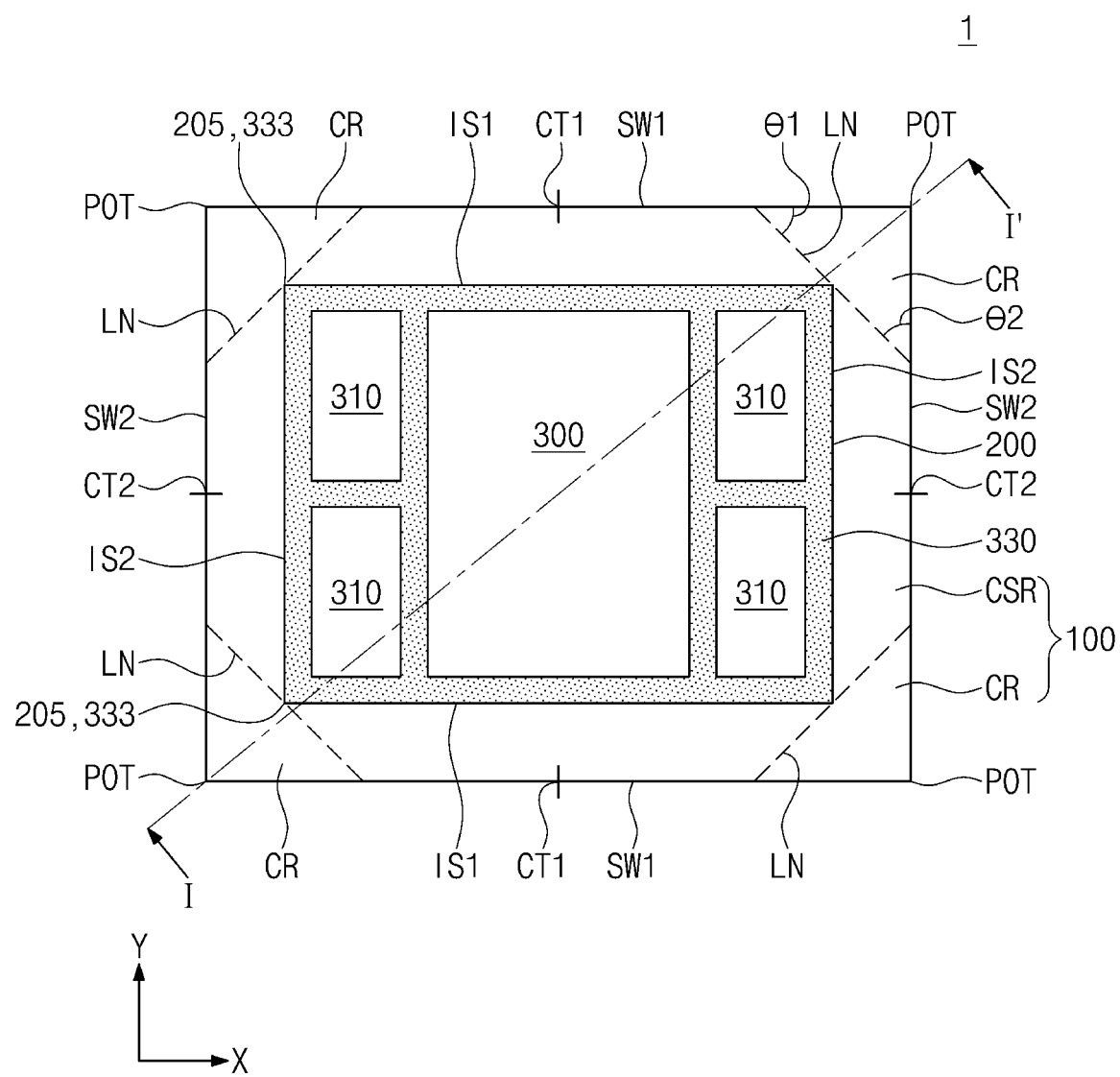
FIG. 1 illustrates a plan view showing a semiconductor package according to some example embodiments of the present inventive concepts.
Figure 2:
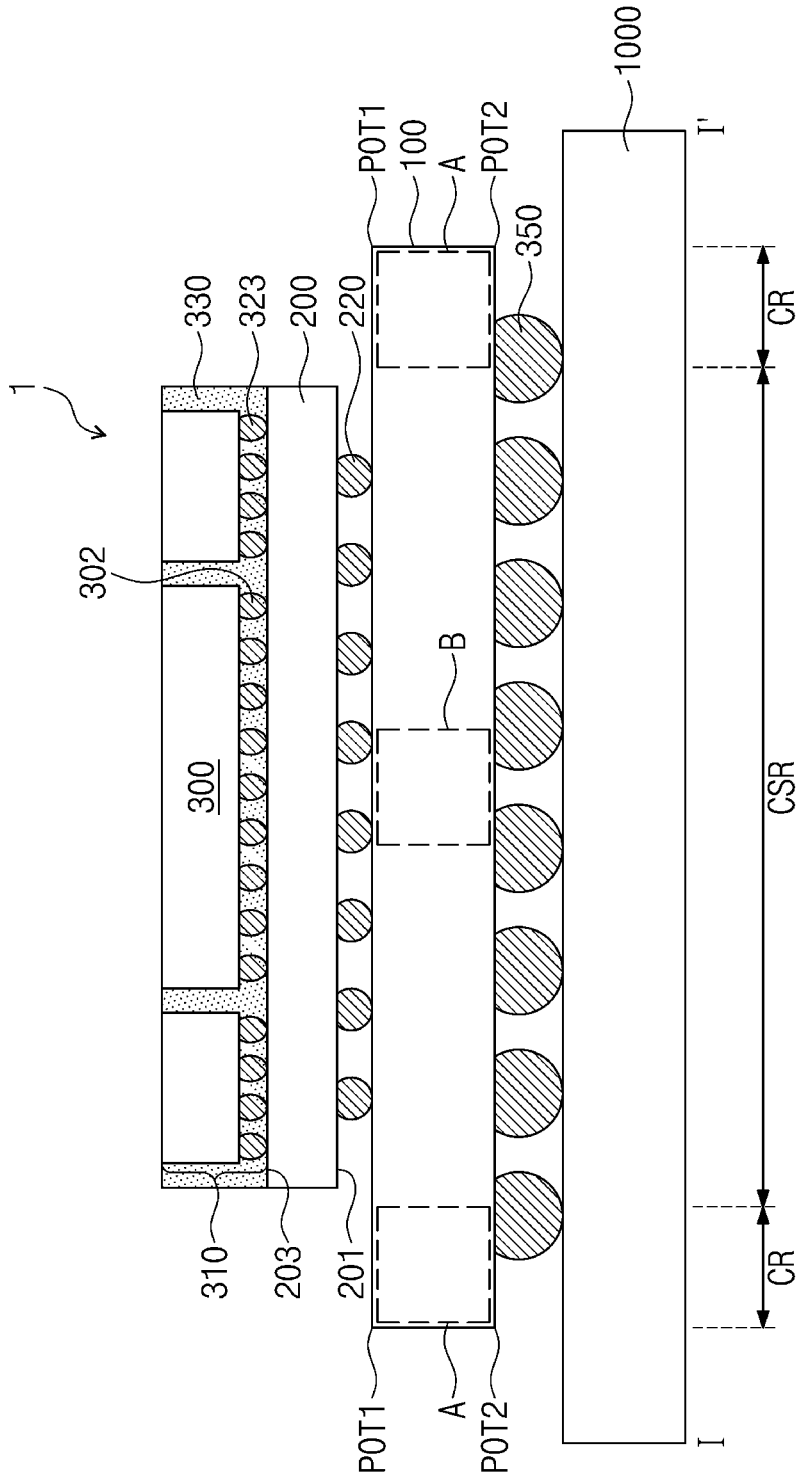
FIG. 2 illustrates a cross-sectional view taken along line I-I' of FIG. 1, showing a semiconductor package according to some example embodiments of the present inventive concepts.
Figure 3:
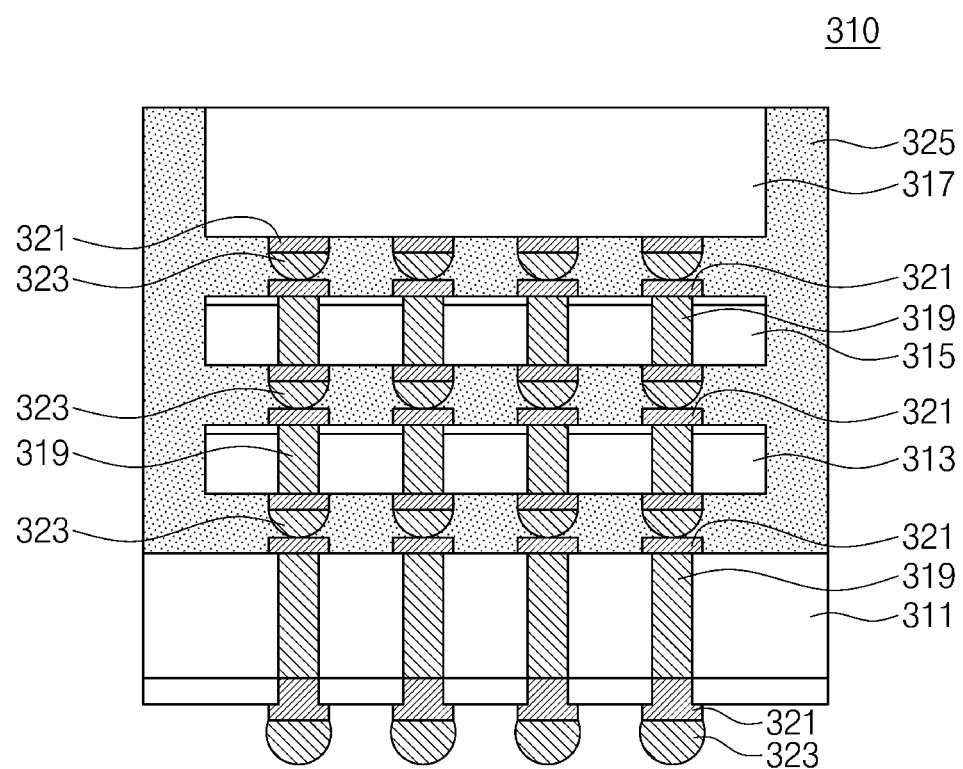
FIG. 3 illustrates an enlarged cross-sectional view showing a chip stack of FIG. 2.
Figure 4A:
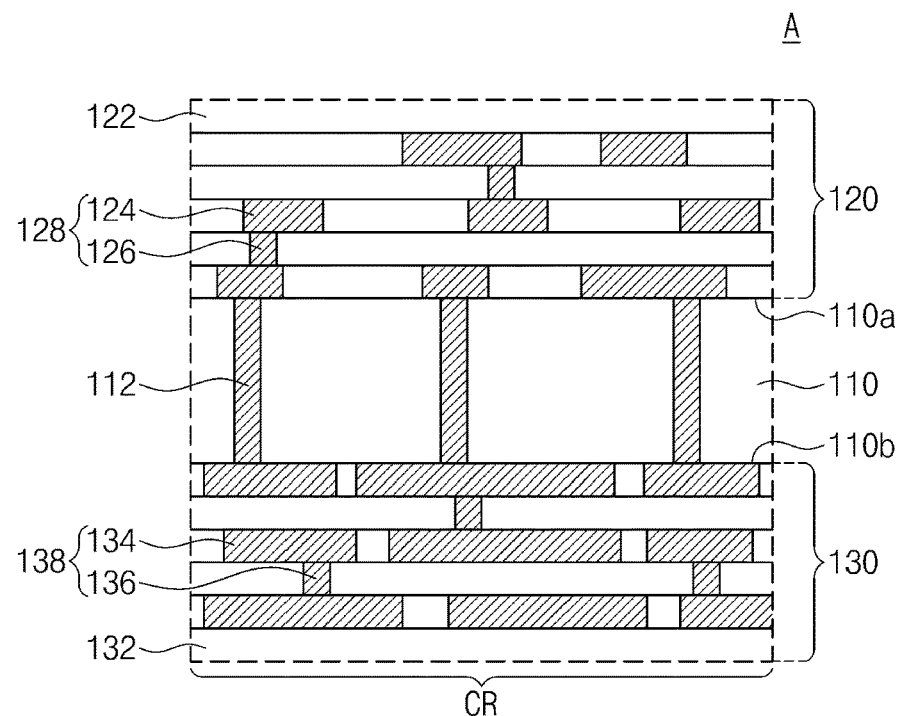
FIG. 4A illustrates an enlarged cross-sectional view showing section A of FIG. 2.
Figure 4B:
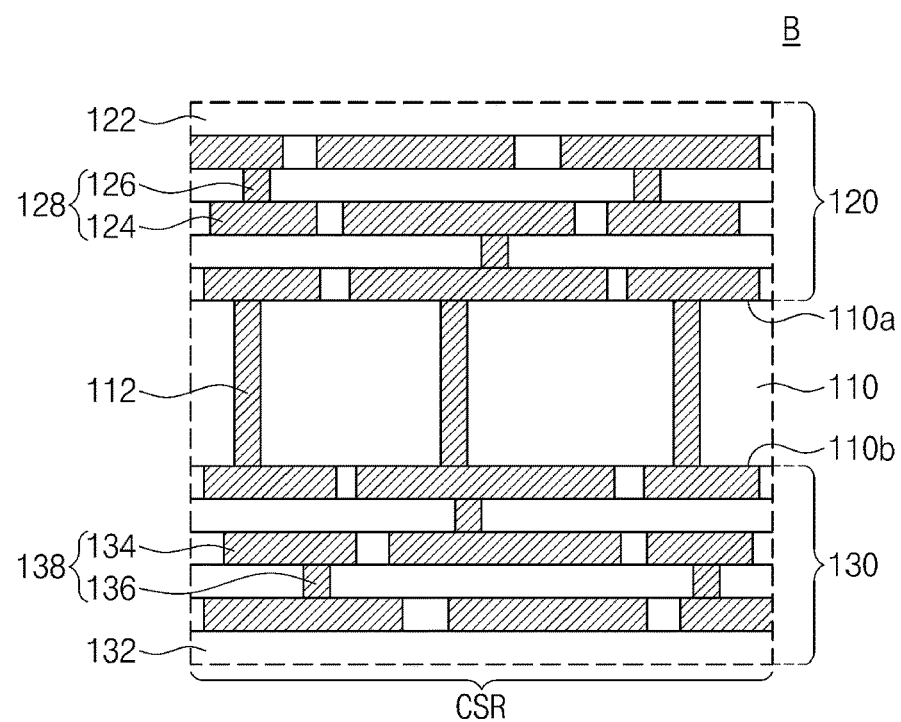
FIG. 4B illustrates an enlarged cross-sectional view showing portion B of FIG. 2.
Figure 5:
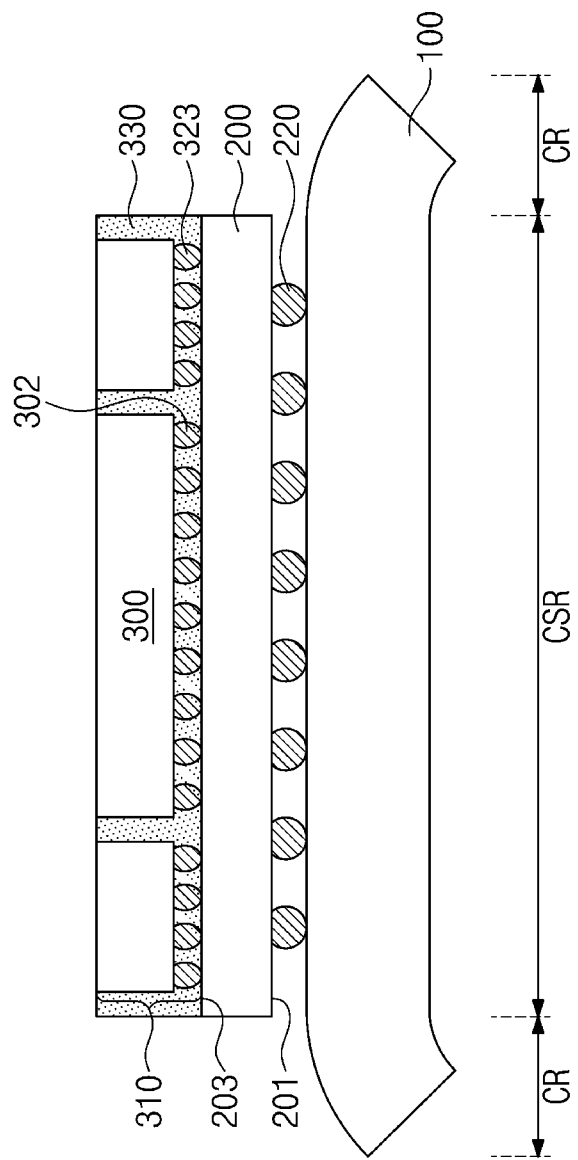
FIG. 5 illustrates a cross-sectional view showing warpage of a package substrate.

FIG. 1 illustrates a plan view showing a semiconductor package according to some example embodiments of the present inventive concepts. FIG. 2 illustrates a cross-sectional view taken along line I-I' of FIG. 1, showing a semiconductor package according to some example embodiments of the present inventive concepts. FIG. 3 illustrates an enlarged cross-sectional view showing a chip stack of FIG. 2. FIG. 4A illustrates an enlarged cross-sectional view showing section A of FIG. 2. FIG. 4B illustrates an enlarged cross-sectional view showing portion B of FIG. 2. FIG. 5 illustrates a cross-sectional view showing warpage of a package substrate.

Referring to FIGS. 1 and 2, a semiconductor package 1 may include a package substrate 100, an interposer substrate 200, first terminals 220, a semiconductor chip 300, chip stacks 310, second terminals 302, and a molding layer 330. The semiconductor package 1 may have a size of about 40 mm×40 mm. The package substrate 100 may be, for example, a printed circuit board (PCB). The package substrate 100 may have a thickness of about 500 μm. The package substrate 100 may include a chip stack region CSR and corner regions CR. The corner regions CR may include corners POT of the package substrate 100. The chip stack region CSR of the package substrate 100 may be a remaining region other than the corner regions CR. The package substrate 100 related to the present inventive concepts will be discussed in detail below.

The interposer substrate 200 may be disposed on the chip stack region CSR of the package substrate 100. The interposer substrate 200 may have a structure in which dielectric layers and metal lines are alternately stacked. The interposer substrate 200 may serve to electrically connect each of the chip stacks 310 to the semiconductor chip 300, the chip stacks 310 to the package substrate 100, and the semiconductor chip 300 to the package substrate 100. The interposer substrate 200 may have a top surface 203 and a bottom surface 201 opposite to each other. The interposer substrate 200 may be disposed such that the bottom surface 201 is closer than the top surface 203 to the package substrate 100. The first terminals 220 may be disposed on the bottom surface 201 of the interposer substrate 200. For example, the first terminals 220 may be placed between the package substrate 100 and the bottom surface 201 of the interposer substrate 200. The first terminals 220 may serve to electrically connect the interposer substrate 200 to the package substrate 100. The first terminals 220 may be disposed on the chip stack region CSR of the package substrate 100, but not on the corner regions CR. The first terminals 220 may be in contact with an upper layer (see 120 of FIGS. 4A and 4B) of the package substrate 100. The first terminals 220 may include, for example, one or more of tin (Sn), lead (Pb), nickel (Ni), gold (Au), silver (Ag), copper (Cu), and bismuth (Bi).

The semiconductor chip 300 may be disposed on the top surface 203 of the interposer substrate 200. The semiconductor chip 300 may be one selected from an LSI (large scale integration), a logic circuit, an image sensor such as CIS (CMOS image sensor), a MEMS (microelectromechanical system) device, an ASIC (application specific integrated circuit) device, and a memory device such as Flash memory, DRAM, SRAM, EEPROM, PRAM, MRAM, ReRAM, HBM (high bandwidth memory), and HMC (hybrid memory cubic), for example. The second terminals 302 may be disposed between the semiconductor chip 300 and the top surface 203 of the interposer substrate 200. The second terminals 302 may electrically connect the semiconductor chip 300 to the interposer substrate 200. The second terminals 302 may include, for example, one or more of tin (Sn), lead (Pb), nickel (Ni), gold (Au), silver (Ag), copper (Cu), and bismuth (Bi).

The chip stacks 310 may be disposed on the top surface 203 of the interposer substrate 200. On the top surface 203 of the interposer substrate 200, the chip stacks 310 may be horizontally spaced apart from the semiconductor chip 300. Neighboring chip stacks 310 may be horizontally spaced apart from each other on the top surface 203 of the interposer substrate 200. In an embodiment, the chip stacks 310 may each be a high bandwidth memory (HBM). As shown in FIG. 3, each of the chip stacks 310 may include a first chip 311, a second chip 313, a third chip 315, a fourth chip 317, chip pads 321, chip terminals 323, and a chip molding layer 325. The second chip 313 may be stacked on the first chip 311, the third chip 315 may be stacked on the second chip 313, and the fourth chip 317 may be stacked on the third chip 315. For example, the second chip 313, the third chip 315, and the fourth chip 317 may be sequentially stacked on a top surface of the first chip 311. For example, the first chip 311 may be a logic semiconductor chip, and the second, third, and fourth chips 313, 315, and 317 may be memory semiconductor chips. The first chip 311 may have a width greater than those of the second, third, and fourth chips 313, 315, and 317.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Through vias 319 may be disposed in the first, second, and third chips 311, 313, and 315. The through vias 319 may penetrate the first, second, and third chips 311, 313, and 315. The through vias 319 may not be provided in the fourth chip 317. The through vias 319 may include a metallic material (e.g., copper, tungsten, or aluminum). The chip pads 321 may be disposed on top and bottom surfaces of the first chip 311, on top and bottom surfaces of the second chip 313, on top and bottom surfaces of the third chip 315, and on a bottom surface of the fourth chip 317. The chip pads 321 on the top and bottom surfaces of the first chip 311 may be disposed on top and bottom surfaces of the through vias 319 which penetrate the first chip 311. The chip pads 321 on the top and bottom surfaces of the second chip 313 may be placed on top and bottom surfaces of the through vias 319 which penetrate the second chip 313. The chip pads 321 on the top and bottom surfaces of the third chip 315 may be placed on top and bottom surfaces of the through vias 319 which penetrate the third chip 315. The chip pads 321 on the bottom surface of the fourth chip 317 may be placed to correspond to the chip pads 321 on the top surface of the third chip 315. The chip pads 321 may include a metallic material (e.g., copper, tungsten, or aluminum).

The chip terminals 323 may be disposed on the chip pads 321 on the bottom surface of the first chip 311. As shown in FIG. 2, the chip terminals 323 may be disposed on the top surface 203 of the interposer substrate 200. The chip terminals 323 may be disposed between the chip pads 321 on the top surface of the first chip 311 and the chip pads 321 on the bottom surface of the second chip 313, between the chip pads 321 on the top surface of the second chip 313 and the chip pads 321 on the bottom surface of the third chip 315, and between the chip pads 321 on the top surface of the third chip 315 and the chip pads 321 on the bottom surface of the fourth chip 317. The chip terminals 323 may include, for example, one or more of tin (Sn), lead (Pb), nickel (Ni), gold (Au), silver (Ag), copper (Cu), and bismuth (Bi).

The chip molding layer 325 may be disposed on the top surface of the first chip 311. On the top surface of the first chip 311, the chip molding layer 325 may cover the second, third, and fourth chips 313, 315, and 317. For example, the chip molding layer 325 may surround/encapsulate the second, third, and fourth chips 313, 315, and 317. The chip molding layer 325 may fill a space between the first chip 311 and the second chip 313, a space between the second chip 313 and the third chip 315, and a space between third chip 315 and the fourth chip 317. The chip molding layer 325 may have a width substantially the same as that of the first chip 311. The chip molding layer 325 may include an epoxy molding compound (EMC).

Referring back to FIGS. 1 and 2, the molding layer 330 may be disposed on the top surface 203 of the interposer substrate 200. The molding layer 330 may cover lateral surfaces of the semiconductor chip 300 and lateral surfaces of the chip stacks 310, and may fill a space between the interposer substrate 200 and the semiconductor chip 300 and a space between the interposer substrate 200 and the first chip (see 311 of FIG. 3) of each of the chip stacks 310. The molding layer 330 may have lateral surfaces aligned with the lateral surfaces of the interposer substrate 200. For example, the molding layer 330 may not cover the corner regions CR of the package substrate 100, and the corner regions CR of the package substrate 100 may be exposed with respect to the molding layer 330. The molding layer 330 may include an epoxy molding compound (EMC).

In an embodiment, the package substrate 100 may have a pair of first lateral surfaces SW1 parallel to a first direction X and a pair of second lateral surfaces SW2 parallel to a second direction Y intersecting the first direction X. The corners POT of the package substrate 100 may be points where the first lateral surfaces SW1 meet their adjacent second lateral surfaces SW2. When viewed in plan view, the corner regions CR may each have a triangular shape. Each of the corner regions CR may be defined by a line LN which obliquely runs across the first and second lateral surfaces SW1 and SW2 (which are adjacent to each other). When viewed in plan view, the line LN may run across and contact each of corners 205 of the interposer substrate 200 and/or each of corners 333 of the molding layer 330. Each of the corners 205 of the interposer substrate 200 may be a point where neighboring first lateral surfaces IS1 of the interposer substrate 200 and second lateral surfaces IS2 of the interposer substrate 200 meet each other. Additionally, the first and second lateral surfaces IS1 and IS2 may respectively be parallel to the first and second directions X and Y. Furthermore, the first and second lateral surfaces IS1 and IS2 of the interposer substrate 200 may respectively be parallel to the first and second lateral surfaces SW1 and SW2 of the package substrate 100. Each of the corners 333 of the molding layer 330 may be a point where neighboring third and fourth lateral surfaces of the molding layer 330 meet each other. Additionally, the third and fourth lateral surfaces of the molding layer 330 may respectively be parallel to the first and second directions X and Y. Furthermore, the third and fourth lateral surfaces of the molding layer 330 may respectively be parallel to the first and second lateral surfaces SW1 and SW2 of the package substrate 100 and/or the first and second lateral surfaces IS1 and IS2 of the interposer substrate 200. Further still, each of corners 333 of the molding layer 330 may correspond to each of corners 205 of the interposer substrate 200. For example, each of corners 333 may be directly above a corresponding one of corners 205.

As illustrated in the example embodiment of FIG. 1, the line LN may not run across either of a center point CT1 of the first lateral surface SW1 and a center point CT2 of the second lateral surface SW2. For example, the line LN may run across a portion of the first lateral surface SW1, which portion is positioned between the corner POT and the center point CT1 of the first lateral surface SW1, and may also run across a portion of the second lateral surface SW2, which portion is positioned between the corner POT and the center point CT2 of the second lateral surface SW2. The line LN and the first lateral surface SW1 may make a first angle θ1 equal to or greater than about 20° and less than about 90°. For example, the first angle θ1 may be about 45°. The line LN and the second lateral surface SW2 may make a second angle θ2 equal to or greater than about 20° and less than about 90°. For example, the second angle θ2 may be about 45°. In this configuration, the first angle θ1 and the second angle θ2 may be substantially the same. Additionally, in this configuration, the corner region CR may be a triangular area comprising a right triangle.

Referring to FIGS. 4A and 4B, the package substrate 100 may include a core layer 110, an upper layer 120, and a lower layer 130. The core layer 110 may have a first surface 110a and a second surface 110b opposite to each other. The upper layer 120 may be disposed on the first surface 110a of the core layer 110, and the lower layer 130 may be disposed on the second surface 110b of the core layer 110. The core layer 110 may include a reinforcement member, such as glass fiber or filler for example. The core layer 110 may include through vias 112 which connect first wiring structures 128 of the upper layer 120 to second wiring structures 138 of the lower layer 130. The through vias 112 may include metal, such as copper for example.

The upper layer 120 may include first dielectric layers 122 and the first wiring structures 128 disposed on the first surface 110a of the core layer 110. The first dielectric layers 122 may be sequentially stacked on the first surface 110a of the core layer 110. The number of the first dielectric layers 122 may be plural, e.g., three or more dielectric layers which together form first dielectric layers 122. The first dielectric layers 122 may include an organic layer and/or a silicon oxide layer. The first wiring structures 128 may be disposed in the first dielectric layers 122. The first wiring structures 128 may include first connection lines 124 and first vias 126. The first connection lines 124 and the first vias 126 may be disposed in the first dielectric layers 122, and the first vias 126 may connect the first connection lines 124 disposed in different dielectric layers of the first dielectric layers 122. The first wiring structures 128 may include metal, such as copper, for example. The lower layer 130 may include second dielectric layers 132 and the second wiring structures 138 disposed on the second surface 110b of the core layer 110. The second dielectric layers 132 may be sequentially stacked on the second surface 110b of the core layer 110. The number of the second dielectric layers 132 may be plural, e.g., three or more dielectric layers which together form second dielectric layers 132. The second dielectric layers 132 may include an organic layer and/or a silicon oxide layer. The second wiring structures 138 may be disposed in the second dielectric layers 132. The second wiring structures 138 may include second connection lines 134 and second vias 136. The second connection lines 134 and the second vias 136 may be disposed in the second dielectric layers 132, and the second vias 136 may connect the second connection lines 134 disposed in different dielectric layers of the second dielectric layers 132. The second wiring structures 138 may include metal, such as copper, for example.

In some example embodiments, the upper layer 120 may have a bottom surface that contacts a top surface of the core layer 110, (e.g., first surface 110a) and a top surface opposite the bottom surface. The top surface of the upper layer may electrically connect with interconnection terminals, e.g., first terminals 220. Additionally, the lower layer 130 may have a top surface that contacts a bottom surface of the core layer, (e.g., second surface 110b) and a top surface opposite the bottom surface. Additionally, in some embodiments, the upper layer 120 may be vertically aligned with the lower layer 130. For example, each corner region CR may include a corresponding portion of an upper layer 120 that is vertically aligned with a corresponding portion of a lower layer 130. In an embodiment, warpage properties of the corner regions CR of the package substrate 100 may be related to and/or depend on thermal expansion coefficients at the corner regions CR of the package substrate 100, and the occurrence of warpage at the corner regions CR of the package substrate 100 may be improved by adjusting a difference between an area proportion (or proportional amount and/or volume) of the first wiring structures 128 to a total area (or proportional amount and/or volume) of the upper layer 120 and an area proportion (or proportional amount and/or volume) of the second wiring structures 138 to a total area of the lower layer 130 (or proportional amount and/or volume). A surface area of the first wiring structures 128 may be a sum of the areas of top surfaces of the first wiring structures 128. For each corner region, a total surface area of the first wiring structures 128 may be a sum of the areas of the top surfaces of each wiring structure of the first wiring structures 128 in the corner region. A surface area of the second wiring structures 138 may be a sum of areas of top surfaces of the second wiring structures 138 in the corner region. A total area of the upper layer 120 may be a top surface of the upper layer 120. A total area of the lower layer 130 may be a top surface of the lower layer 130.

In an example embodiment, warpage properties of the corner regions CR of the package substrate 100 may be related to and/or depend on thermal expansion coefficients at the corner regions CR of the package substrate 100, and the occurrence of warpage at the corner regions CR of the package substrate 100 may be improved by adjusting (1) the thermal expansion coefficients at the corner regions CR relative to the thermal expansion coefficient of the package substrate, (2) the thermal expansion coefficients at the corner regions CR of the upper layer relative to the thermal expansion coefficient of the total upper layer 120, (3) the thermal expansion coefficients at the corner regions CR of the lower layer 130 relative to the thermal expansion coefficient of the total lower layer 130, and/or (4) the thermal expansion coefficients at the upper layer 120 of the corner regions CR relative to the thermal expansion coefficients at the lower layer 130 of the corner regions CR and thermal expansion coefficients at the core layer 110 of the corner regions CR. For example, the thermal expansion coefficient at the corner region CR of the upper layer 120 may be adjusted by changing a first area proportion of first wiring structures 128 in the corner region CR relative to the total area and/or amount of upper layer 120. Likewise, for example, the thermal expansion coefficient at the corner region CR of the lower layer 130 may be adjusted by changing a second area proportion of second wiring structures 138 in the corner region CR relative to the total area and/or amount of the lower layer 120. Additionally, the first area proportion may be less than the second area proportion. Furthermore, the thermal expansion coefficient of the upper layer 120 may be greater than the thermal expansion coefficient of the lower layer. In this way, downward warpage may be prevented and/or suppressed (see FIG. 5).

As used herein, the terms "thermal expansion" and "thermal expansion coefficient" are meant in the broadest sense to cover all types of thermal expansion, e.g., changes in length compared to original length ($\Delta l/l0$) which may be referred to as linear expansion in the art; changes in area compared to original area ($\Delta A/A0$) which may be referred to as areal expansion or superficial expansion in the art; and changes in volume compared to original volume ($\Delta V/V0$) which may be referred to as volumetric expansion or cubical expansion in the art. It shall be understood that the specific type of thermal expansion discussed with reference to the example embodiments will be clear by context.

On each of the corner regions CR, the upper layer 120 may vertically overlap the lower layer 130. The corners POT may include upper corners (see POT1 of FIG. 2) and lower corners (see POT2 of FIG. 2). The upper corners POT1 may each be a point where the first and second lateral surfaces SW1 and SW2 meet a top surface of the package substrate 100 (or top surface of the upper layer 120), and the lower corners POT2 may each be a point where the first and second lateral surfaces SW1 and SW2 meet a bottom surface of the package substrate 100 (or bottom surface of the lower layer 130). The area proportion of the first wiring structures 128 on each of the corner regions relative to the total area of the upper layer 120 on each of the corner regions CR may be less than the area proportion of the second wiring structures 138 on each of the corner regions relative to the total area of the lower layer 130 on each of the corner regions CR. For example, a first area proportion of top surfaces of the first wiring structures 128 in the upper layer 120 relative to a total area of the top surface on each of the corner regions is less than a second area proportion of top surfaces of the second wiring structures 138 in the lower layer 130 relative to a total area of the top surface on each of the corner regions.

A difference between the area proportion of the second wiring structures 138 on the corner regions CR and the area proportion of the first wiring structures 128 on the corner regions CR may range from about 10% to about 50%. For example, for each corner region, a difference between a first area proportion of top surfaces of the first wiring structures relative to a total plan view area covered by the corner region, and a second area proportion of top surfaces of the second wiring structures relative to the total plan view area covered by the corner region, is within a range of 10% to 50%." An area (amount) proportion of the first dielectric layers 122 on each of the corner regions CR to the total area of the upper layer 120 on each of the corner regions CR may be greater than an area (amount) proportion of the second dielectric layers 132 on each of the corner regions CR to the total area of the lower layer 130 on each of the corner regions CR. As the area proportion of the first dielectric layers 122 on each of the corner regions CR becomes larger than the area proportion of the second dielectric layers 132 on each of the corner regions CR, a thermal expansion coefficient of the upper layer 120 on each of the corner regions CR may become greater than a thermal expansion coefficient of the lower layer 130 on each of the corner regions CR. For example, an area proportion of the first dielectric layers 122 in the upper layer 120 relative to a total area of the upper layer 120 on each of the corner regions is greater than an area proportion of the second dielectric layers 132 in the lower layer 130 relative to a total area of the lower layer 130 on each of the corner regions. The area proportion of the first wiring structures 128 on each of the corner regions CR to the total area of the upper layer 120 on each of the corner regions CR may be less than the area proportion of the first wiring structures 128 to the total area of the upper layer 120 on the chip stack region CSR. For example, the area proportion of the first dielectric layers 122 on each of the corner regions CR may be greater than the area proportion of the first dielectric layers 122 on the chip stack region CSR.

The package substrate 100 may expand due to high temperature during a soldering process in which the semiconductor chip 300 and the chip stacks 310 are attached to the package substrate 100, and after the soldering process, the package substrate 100 may be returned into a state under room temperature and thus may contract again. The contraction of the package substrate 100 may cause its corner regions CR to bend downward as illustrated in FIG. 5. In a case that the corner regions CR of the package substrate 100 are bent downward, when the package substrate 100 is mounted on a board 1000, the corner regions CR and the board 1000 may contact each other to create an electrical short therebetween and to arise a problem in connection with reliability of semiconductor devices.

According to some example embodiments of the present inventive concepts, a thermal expansion coefficient of the upper layer 120 on each of the corner regions CR may be set greater than a thermal expansion coefficient of the lower layer 130 on each of the corner regions CR, and therefore, the corner regions CR of the package substrate 100 may be prevented from being bent downward or may have reduced downward bending. Therefore, an electrical short between the package substrate 100 and the board 1000 may be prevented when the semiconductor package 1 is mounted on the board 1000, and as a result, the semiconductor package 1 may increase in reliability.

Referring back to FIG. 2, the semiconductor package 1 may be disposed on the board 1000. The semiconductor package 1 may be mounted on the board 1000 through external terminals 350 disposed on the bottom surface of the package substrate 100. The external terminals 350 may include, for example, one or more of tin (Sn), lead (Pb), nickel (Ni), gold (Au), silver (Ag), copper (Cu), and bismuth (Bi). The board 1000 may be a printed circuit board (PCB).

Figure 6:
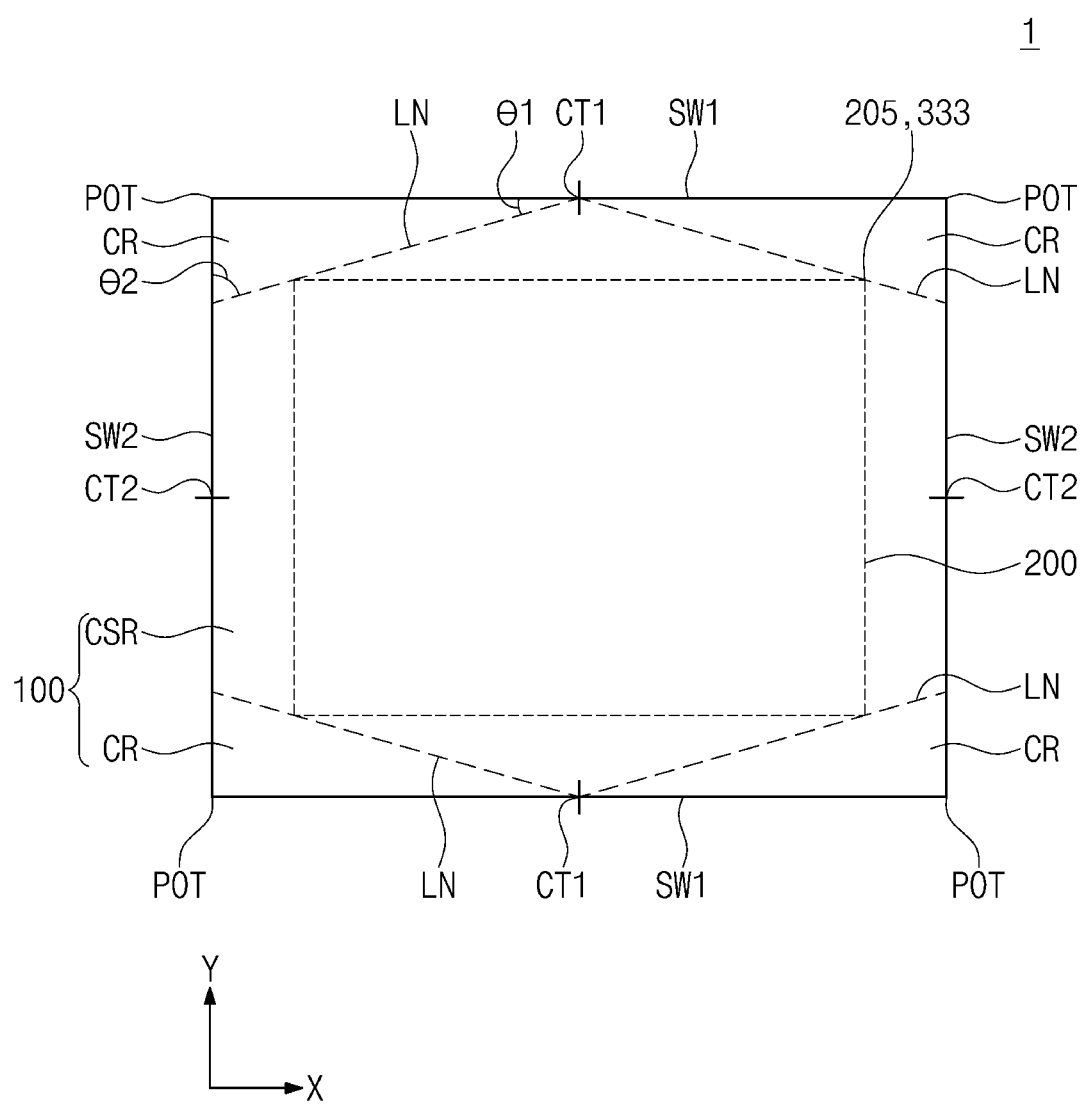
FIG. 6 illustrates a plan view showing a semiconductor package according to some example embodiments of the present inventive concepts.

FIG. 6 illustrates a plan view showing a semiconductor package according to some example embodiments of the present inventive concepts.

Referring to FIG. 6, when viewed in plan view, each of the corner regions CR of the package substrate 100 may be defined by the line LN which obliquely runs across the first and second lateral surfaces SW1 and SW2 of the package substrate 100. When viewed in plan view, the corner regions CR may each have a triangular shape and/or be a right triangle. When viewed in plan view, the line LN may run across and contact the center point CT1 of the first lateral surface SW1, the corner 205 of the interposer substrate 200, and/or the corner 333 of the molding layer 330. The line LN may run across the second lateral surface SW2 of the package substrate 100, but may not contact the center point CT2 of the second lateral surface SW2. For example, the line LN may run across a portion of the second lateral surface SW2, which portion is positioned between the corner POT of the package substrate 100 and the center point CT2 of the second lateral surface SW2. The line LN and the first lateral surface SW1 may make the first angle θ1 equal to or greater than about 20° and less than 90°. The line LN and the second lateral surface SW2 may make the second angle θ2 equal to or greater than about 20° and less than 90°. The first angle θ1 and the second angle θ2 may be different from each other. For example, the first angle θ1 may be less than the second angle θ2.

Figure 7:
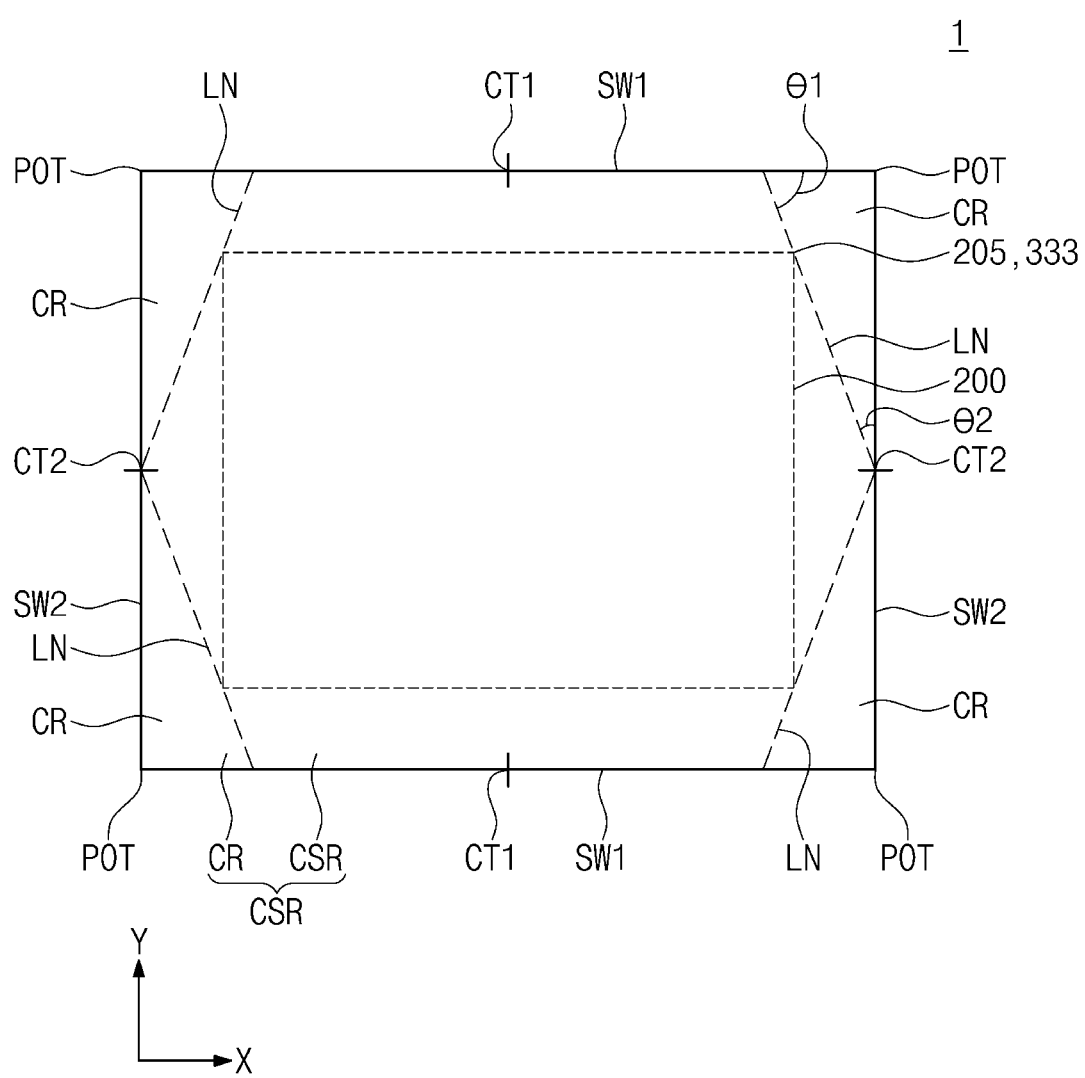
FIG. 7 illustrates a plan view showing a semiconductor package according to some example embodiments of the present inventive concepts.

FIG. 7 illustrates a plan view showing a semiconductor package according to some example embodiments of the present inventive concepts.

Referring to FIG. 7, when viewed in plan view, each of the corner regions CR of the package substrate 100 may be defined by the line LN which obliquely runs across the first and second lateral surfaces SW1 and SW2 of the package substrate 100. When viewed in plan view, the corner regions CR may each have a triangular shape and/or be a right triangle. When viewed in plan view, the line LN may run across and contact the center point CT2 of the second lateral surface SW2, the corner 205 of the interposer substrate 200, and/or the corner 333 of the molding layer 330. The line LN may run across the first lateral surface SW1 of the package substrate 100, but may not contact the center point CT1 of the first lateral surface SW1. For example, the line LN may run across a portion of the first lateral surface SW1, which portion is positioned between the corner POT of the package substrate 100 and the center point CT1 of the first lateral surface SW1. The line LN and the first lateral surface SW1 may make the first angle θ1 equal to or greater than about 20° and less than 90°. The line LN and the second lateral surface SW2 may make the second angle θ2 equal to or greater than about 20° and less than 90°. The first angle θ1 and the second angle θ2 may be different from each other. For example, the first angle θ1 may be greater than the second angle θ2.

Figure 8:
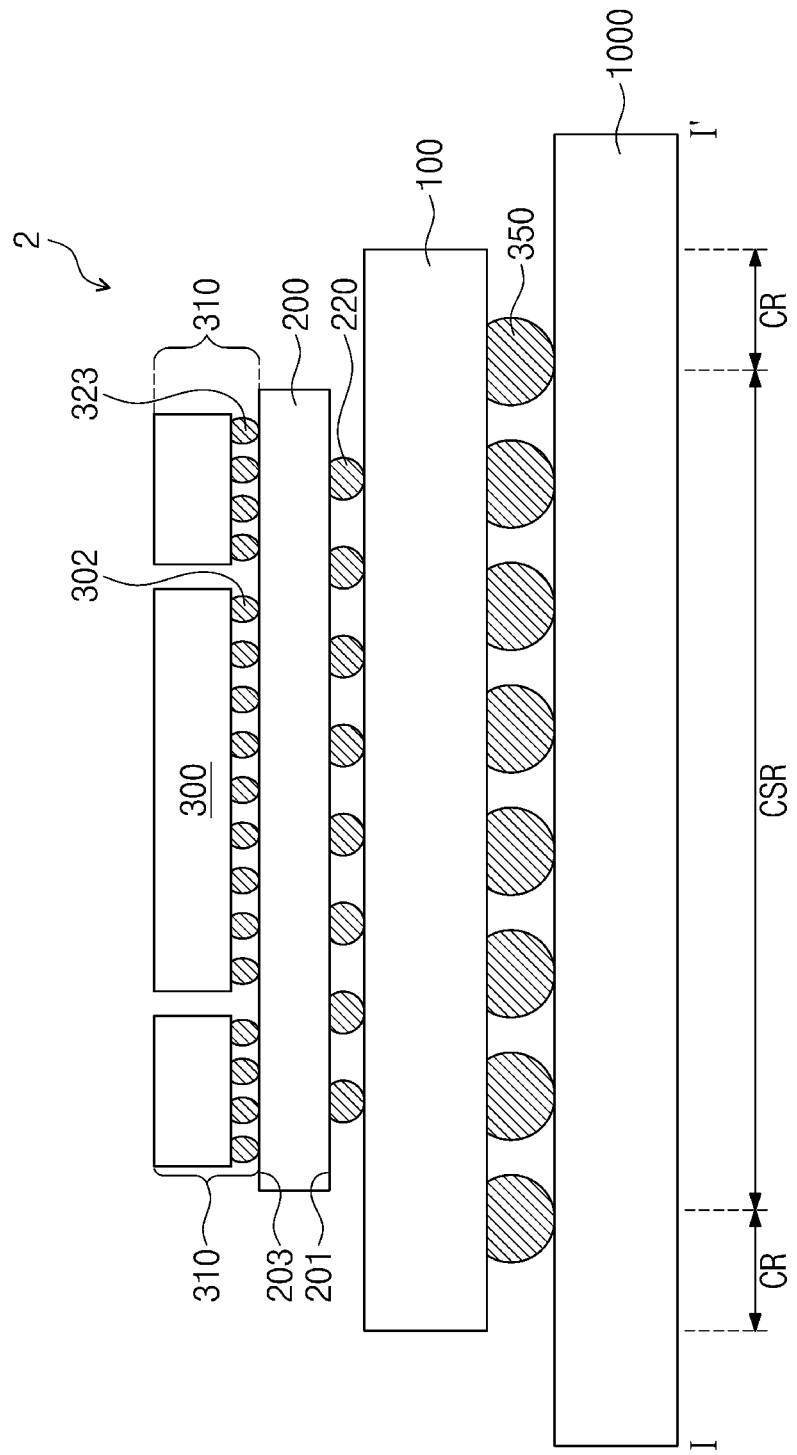
FIG. 8 illustrates a cross-sectional view taken along line I-I' of FIG. 1, showing a semiconductor package according to some example embodiments of the present inventive concepts.

FIG. 8 illustrates a cross-sectional view taken along line I-I' of FIG. 1, showing a semiconductor package according to some example embodiments of the present inventive concepts.

Referring to FIG. 8, a semiconductor package 2 may include the package substrate 100, the interposer substrate 200, the first terminals 220, the semiconductor chip 300, the chip stacks 310, and the second terminals 302. In the example embodiment of FIG. 8, the molding layer 330 shown in FIG. 2 may be omitted. Therefore, the lateral surfaces of the semiconductor chip 300, of the chip stacks 310, and of the second terminals 302 may be exposed to air.

Figure 9:
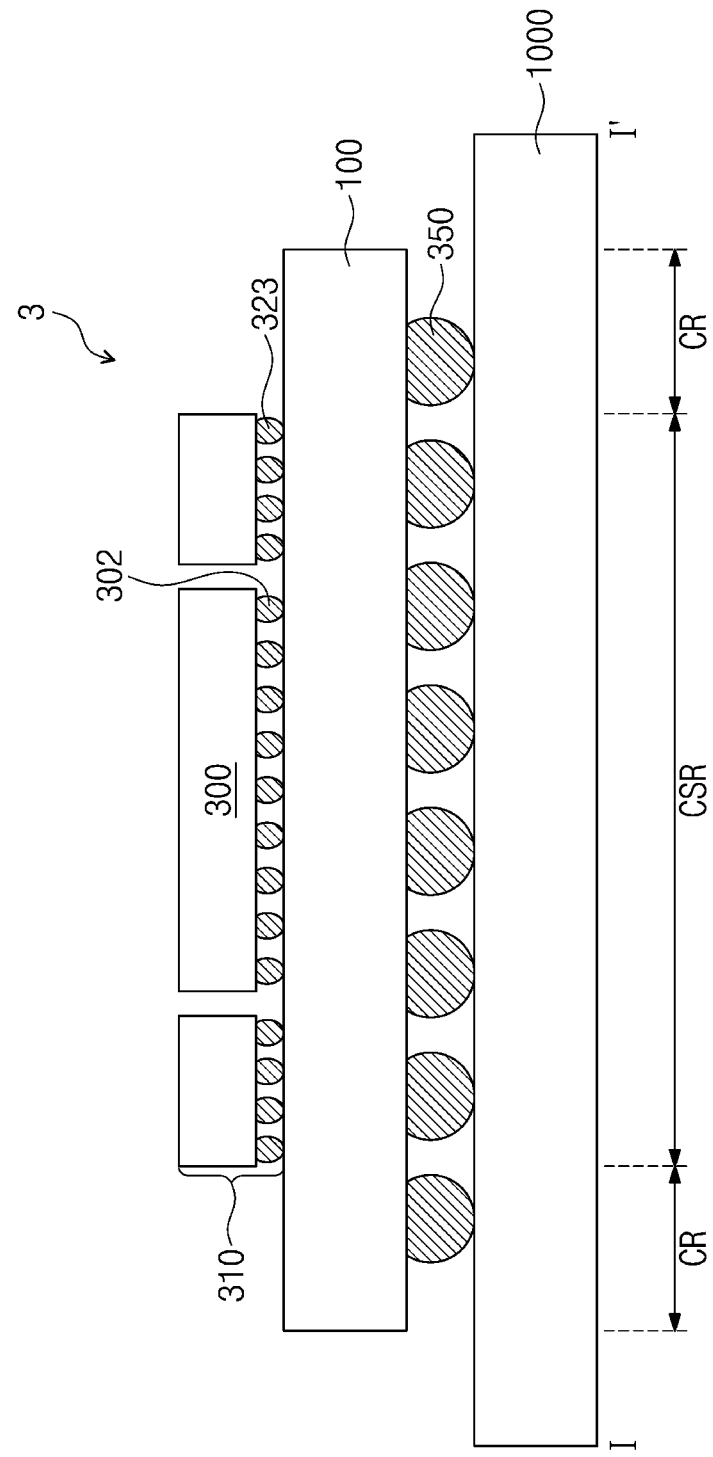
FIG. 9 illustrates a cross-sectional view taken along line I-I' of FIG. 1, showing a semiconductor package according to some example embodiments of the present inventive concepts.

FIG. 9 illustrates a cross-sectional view taken along line I-I' of FIG. 1, showing a semiconductor package according to some example embodiments of the present inventive concepts.

Referring to FIG. 9, a semiconductor package 3 may include the package substrate 100, the semiconductor chip 300, the chip stacks 310, and the second terminals 302. In the example embodiment of FIG. 9, the interposer substrate 200 and the first terminals 220 shown in FIG. 2 may be omitted. The semiconductor chip 300 and the chip stacks 310 may be directly mounted on the chip stack region CSR of the package substrate 100. The second terminals 302 may be in direct contact with the top surface of the package substrate 100, and the chip terminals 323 of the chip stacks 310 may also be in direct contact with the top surface of the package substrate 100.

Figure 10:
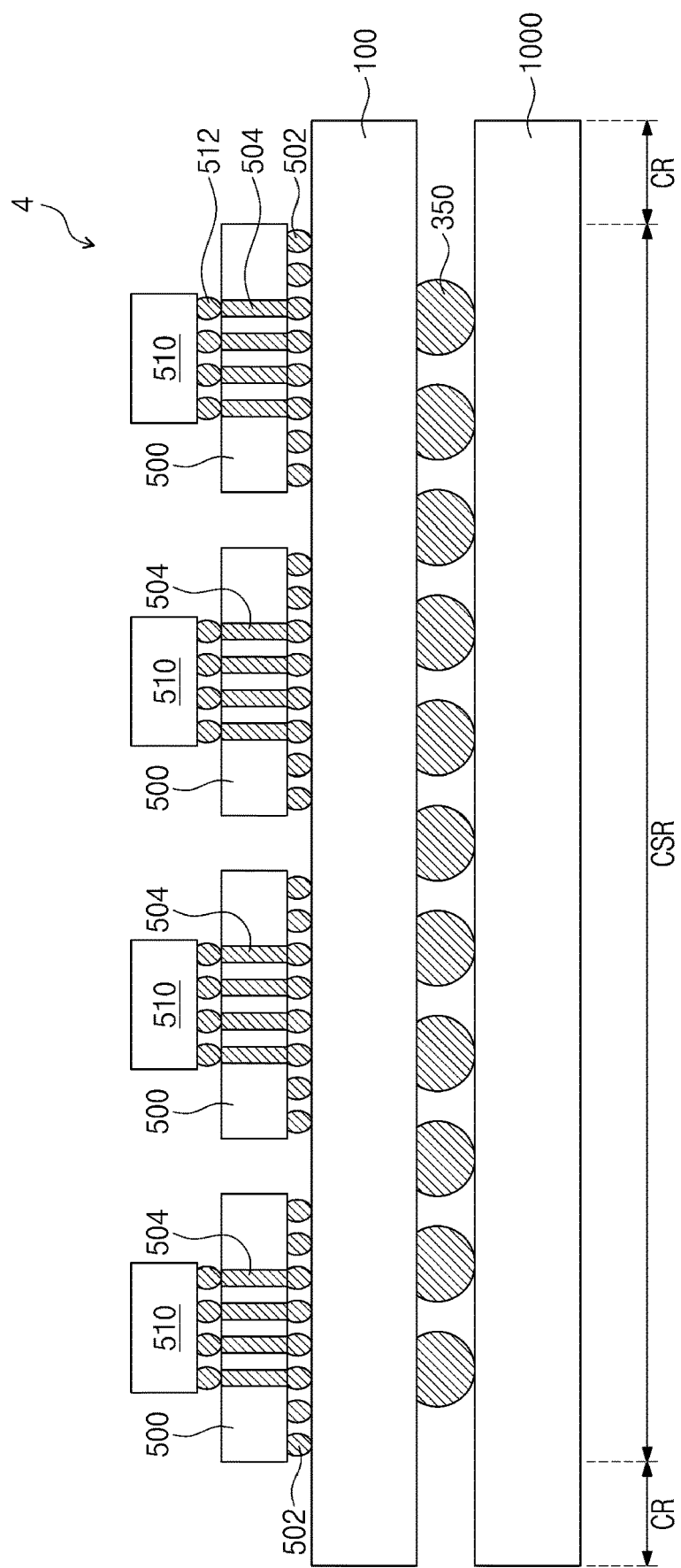
FIG. 10 illustrates a cross-sectional view showing a semiconductor package according to some example embodiments of the present inventive concepts.

FIG. 10 illustrates a cross-sectional view showing a semiconductor package according to some example embodiments of the present inventive concepts.

Referring to FIG. 10, a semiconductor package 4 may include the package substrate 100, first semiconductor chips 500, first terminals 502, second semiconductor chips 510, and second terminals 512. The first semiconductor chips 500 may be disposed on the chip stack region CSR of the package substrate 100. The first semiconductor chips 500 may be spaced apart from each other at a regular interval on the top surface of the package substrate 100. The first semiconductor chips 500 may be selected from: an LSI (large scale integration), a logic circuit, an image sensor such as CIS (CMOS image sensor), a MEMS (microelectromechanical system) device, an ASIC (application specific integrated circuit) device, and a memory device such as Flash memory, DRAM, SRAM, EEPROM, PRAM, MRAM, ReRAM, HBM (high bandwidth memory), and HMC (hybrid memory cubic), for example. Through vias 504 may be disposed to penetrate the first semiconductor chips 500. The through vias 504 may include a metallic material (e.g., copper, aluminum, or tungsten). The first terminals 502 may be disposed between the first semiconductor chips 500 and the package substrate 100. The first terminals 502 may electrically connect the first semiconductor chips 500 to the package substrate 100. The first terminals 502 may be electrically connected to the through vias 504. The first terminals 502 may include, for example, one or more of tin (Sn), lead (Pb), nickel (Ni), gold (Au), silver (Ag), copper (Cu), and bismuth (Bi).

The second semiconductor chips 510 may be disposed on the first semiconductor chips 500. The second semiconductor chips 510 may be selected from an LSI (large scale integration), a logic circuit, an image sensor such as CIS (CMOS image sensor), a MEMS (microelectromechanical system) device, an ASIC (application specific integrated circuit) device, and a memory device such as Flash memory, DRAM, SRAM, EEPROM, PRAM, MRAM, ReRAM, HBM (high bandwidth memory), and HMC (hybrid memory cubic), for example. The second terminals 512 may be disposed between the first semiconductor chips 500 and the second semiconductor chips 510. The second terminals 512 may be electrically connected to the through vias 504. The second terminals 512 may include, for example, one or more of tin (Sn), lead (Pb), nickel (Ni), gold (Au), silver (Ag), copper (Cu), and bismuth (Bi).

According to some example embodiments of the present inventive concepts, on corner regions of a package substrate, an area proportion of a wiring structure(s) disposed in an upper layer of the package substrate may be less than an area proportion of a wiring structure(s) disposed in a lower layer of the package substrate. Therefore, the upper layer of the package substrate may have a thermal expansion coefficient greater than that of the lower layer of the package substrate, and accordingly, the corner regions of the package substrate may be prevented from being bent downward after a soldering process in which an interposer substrate and/or semiconductor chips are attached to the package substrate. As a result, when the package substrate is mounted on a board, the corner regions of the package substrate may be prevented from being in contact with the board.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A semiconductor package, comprising:
   a package substrate which includes a plurality of corner regions, each of the corner regions defined by a first lateral surface of the package substrate that extends parallel to a first direction, a second lateral surface of the package substrate that extends parallel to a second direction intersecting the first direction, and a line which runs between the first lateral surface and the second lateral surface and each of the corner regions includes a corner of the package substrate, the corner being where the first lateral surface meets the second lateral surface;
   an interposer substrate on the package substrate, wherein the interposer substrate does not overlap the corner regions of the package substrate in a third direction perpendicular to the first direction and the second direction; and
   a first semiconductor chip on the interposer substrate,
   wherein the package substrate further includes:
      a core layer having a first surface and a second surface opposite the first surface;
      an upper layer, which includes a plurality of first wiring structures and a plurality of first dielectric layers, on the first surface of the core layer; and
      a lower layer, which includes a plurality of second wiring structures and a plurality of second dielectric layers, on the second surface of the core layer,
      wherein an area proportion of top surfaces of the first wiring structures in the upper layer relative to a top surface of the upper layer on each of the corner regions is less than an area proportion of top surfaces of the second wiring structures in the lower layer relative to a top surface of the lower layer on each of the corner regions.

2. The semiconductor package of claim 1, wherein each of the corner regions has a triangular shape when viewed in plan view.

3. The semiconductor package of claim 1, wherein a first angle between the line and the first lateral surface is the same as a second angle between the line and the second lateral surface.

4. The semiconductor package of claim 1, wherein a first angle between the line and the first lateral surface is different from a second angle between the line and the second lateral surface.

5. The semiconductor package of claim 1, wherein the line runs across one of a center point of the first lateral surface and a center point of the second lateral surface.

6. The semiconductor package of claim 1, wherein
   the line runs across a portion of the first lateral surface, the portion of the first lateral surface being between the corner and a center point of the first lateral surface, and
   the line runs across a portion of the second lateral surface, the portion of the second lateral surface being between the corner and a center point of the second lateral surface.

7. The semiconductor package of claim 1, further comprising a molding layer which covers lateral surfaces of the first semiconductor chip on the package substrate,
   wherein, when viewed in plan view, the molding layer does not cover the corner regions of the package substrate and the package substrate is exposed.

8. The semiconductor package of claim 1, wherein a thermal expansion coefficient of the upper layer is greater than a thermal expansion coefficient of the lower layer.

9. The semiconductor package of claim 1, wherein an area proportion of top surfaces of the first dielectric layers in the upper layer relative to the top surface of the upper layer on each of the corner regions is greater than an area proportion of the second dielectric layers in the lower layer relative to the top surface of the lower layer on each of the corner regions.

10. The semiconductor package of claim 1, further comprising:
a plurality of terminals between the interposer substrate and the package substrate,
wherein the plurality of terminals are not disposed on any of the corner regions of the package substrate,
wherein the upper layer includes a bottom surface that contacts an upper surface of the core layer,
wherein the lower layer includes a bottom surface opposite the top surface, and the top surface of the lower layer contacts a bottom surface of the core layer,
wherein the upper layer is vertically aligned with the lower layer.

11. The semiconductor package of claim 1, further comprising a chip stack on the package substrate and horizontally spaced apart from the first semiconductor chip,
wherein the chip stack includes a plurality of semiconductor chips which are vertically stacked on the package substrate.

12. The semiconductor package of claim 1, further comprising a second semiconductor chip on the package substrate that is horizontally spaced apart from the first semiconductor chip,
wherein the first semiconductor chip and the second semiconductor chip are logic semiconductor chips.

* * * * *